United States Patent
Shu et al.

(10) Patent No.: US 11,075,298 B2
(45) Date of Patent: Jul. 27, 2021

(54) LDMOS INTEGRATED CIRCUIT PRODUCT

(71) Applicant: GLOBALFOUNDRIES U.S. Inc., Santa Clara, CA (US)

(72) Inventors: Jiehui Shu, Clifton Park, NY (US); Judson R. Holt, Ballston Lake, NY (US); Sipeng Gu, Clifton Park, NY (US); Halting Wang, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 37 days.

(21) Appl. No.: 16/454,238

(22) Filed: Jun. 27, 2019

(65) Prior Publication Data
US 2020/0411684 A1 Dec. 31, 2020

(51) Int. Cl.
| | |
|---|---|
| *H01L 29/78* | (2006.01) |
| *H01L 29/06* | (2006.01) |
| *H01L 29/41* | (2006.01) |
| *H01L 29/66* | (2006.01) |
| H01L 29/417 | (2006.01) |

(52) U.S. Cl.
CPC ...... *H01L 29/7816* (2013.01); *H01L 29/0653* (2013.01); *H01L 29/66545* (2013.01); *H01L 29/66689* (2013.01); *H01L 29/41783* (2013.01)

(58) Field of Classification Search
CPC ............. H01L 29/7816; H01L 29/0653; H01L 29/41783
See application file for complete search history.

(56) References Cited

U.S. PATENT DOCUMENTS

| | | | |
|---|---|---|---|
| 8,461,647 B2 * | 6/2013 | Chou | H01L 29/7835 257/335 |
| 8,981,449 B2 * | 3/2015 | Bedell | H01L 29/66825 257/314 |
| 9,082,852 B1 | 7/2015 | Liu et al. | |
| 9,379,236 B2 | 6/2016 | Ponoth et al. | |
| 9,536,991 B1 | 1/2017 | Zang et al. | |
| 9,922,976 B1 * | 3/2018 | Chen | H01L 21/28088 |
| 10,388,649 B2 * | 8/2019 | Chiu | H01L 21/823892 |
| 10,475,901 B1 * | 11/2019 | Thees | H01L 21/823437 |
| 10,600,877 B2 * | 3/2020 | Cheng | H01L 21/265 |
| 2006/0267118 A1 * | 11/2006 | Aiso | H01L 21/823437 257/412 |
| 2015/0235908 A1 * | 8/2015 | Cheng | H01L 21/845 257/351 |

(Continued)

*Primary Examiner* — Ida M Soward
(74) *Attorney, Agent, or Firm* — Francois Pagette; Hoffman Warnick LLC

(57) ABSTRACT

One illustrative integrated circuit product disclosed herein includes a gate structure positioned above a semiconductor substrate, a source region and a drain region, both of which include an epi semiconductor material, wherein at least a portion of the epi semiconductor material in the source and drain regions is positioned in the substrate. In this example, the IC product also includes an isolation structure positioned in the substrate between the source region and the drain region, wherein the isolation structure includes a channel-side edge and a drain-side edge, wherein the channel-side edge is positioned vertically below the gate structure and wherein a portion of the substrate laterally separates the isolation structure from the epi semiconductor material in the drain region.

20 Claims, 7 Drawing Sheets

(56) References Cited

U.S. PATENT DOCUMENTS

| | | |
|---|---|---|
| 2016/0254180 A1 | 9/2016 | Liu et al. |
| 2017/0005193 A1 | 1/2017 | Ng et al. |
| 2019/0096764 A1* | 3/2019 | Walke .................. H01L 23/535 |

* cited by examiner

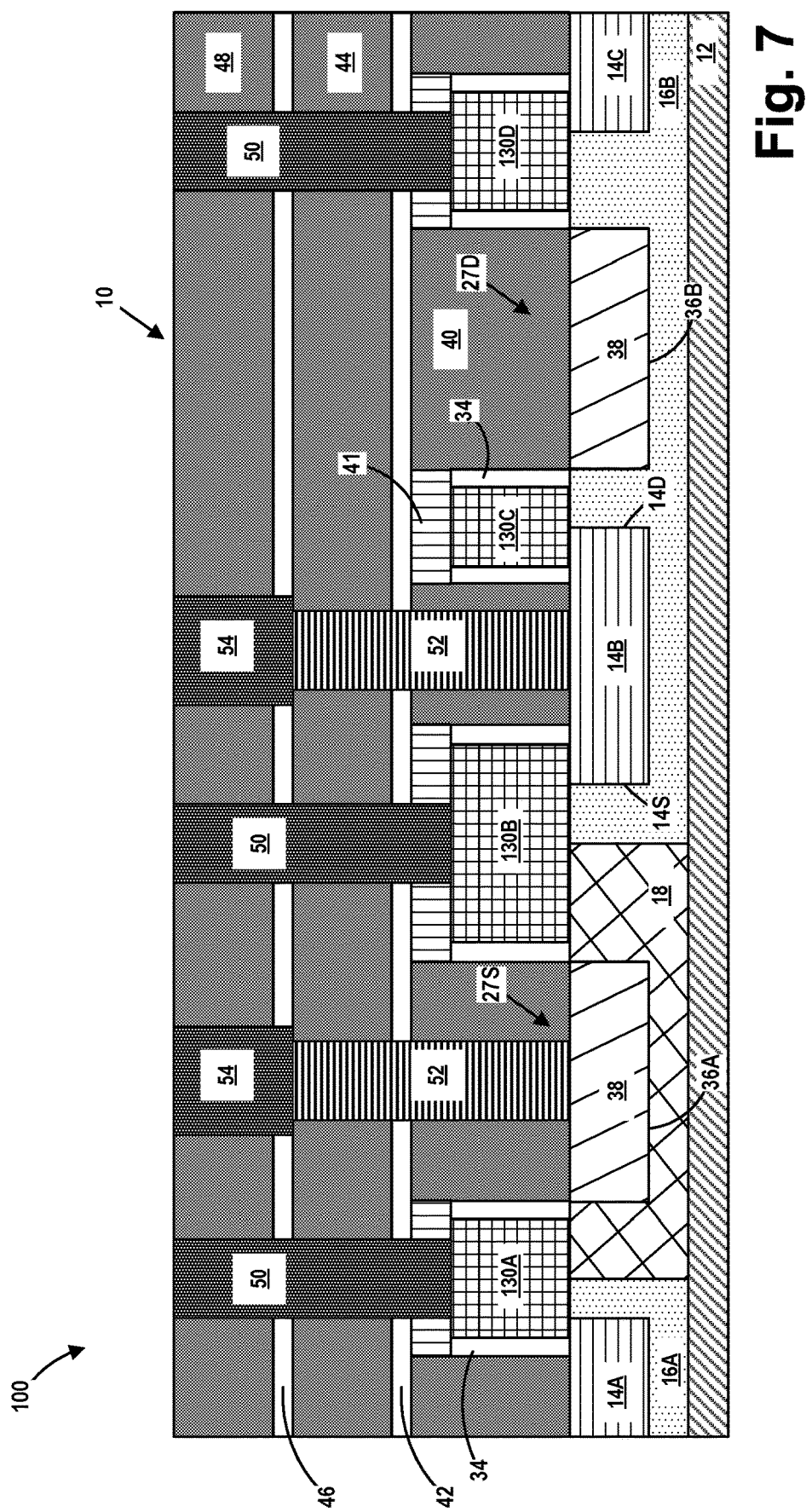

LDMOS INTEGRATED CIRCUIT PRODUCT

BACKGROUND

Field of the Invention

The present disclosure generally relates to various methods of forming an LDMOS (lateral diffused MOS) transistor and an integrated circuit (IC) product that includes such an LDMOS transistor device.

Description of the Related Art

There are two major structural categories of RF MOS transistors in use today. These transistors include DMOS (double-diffused Metal Oxide Semiconductor) devices and LDMOS (laterally diffused Metal Oxide Semiconductor) devices. DMOS and LDMOS devices have unique geometries, unique behaviors and require unique fabrication techniques to fabricate such devices. In recent years, LDMOS transistors have been increasingly applied in high voltage and smart power applications. An LDMOS transistor typically includes source and drain regions that are comprised of epitaxial semiconductor material that is grown in cavities formed in the substrate. Generally, an LDMOS transistor has an asymmetric structure with a drift region located between the channel of the LDMOS channel and drain region. The drift region includes an isolation structure that is formed in the substrate between the epi semiconductor material source/drain regions, wherein a portion of the isolation structure is positioned vertically below the gate structure of the LDMOS transistor.

Problems have arisen as it relates to the formation of the epi semiconductor material in drain regions of such LDMOS devices. In some prior art situations, formation of the epi cavity in the drain region would expose a portion of the isolation structure. As a result, the growth of the epi semiconductor material in the epi cavity may be substantially less uniform leading to incomplete or irregular filling of the epi cavity. Such incomplete formation of the epi semiconductor material in drain regions of an LDMOS device can lead to reduced device performance due to the reduced volume of epi semiconductor material in the drain region and/or complete device failure if a conductive contact structure cannot adequately be formed to contact the reduced-size region of epi semiconductor material.

The present disclosure is generally directed to various novel methods of forming an LDMOS transistor and an IC product that includes such an LDMOS device that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming an LDMOS transistor and an IC product that includes such an LDMOS device. One illustrative integrated circuit product disclosed herein includes a gate structure positioned above a semiconductor substrate, a source region and a drain region, both of which comprise an epi semiconductor material, wherein at least a portion of the epi semiconductor material in the source region and the epi semiconductor material in the drain region are positioned in the substrate. In this example, the IC product also includes an isolation structure positioned in the substrate between the source region and the drain region, wherein the isolation structure comprises a channel-side edge and a drain-side edge, wherein the channel-side edge is positioned vertically below the gate structure and wherein a portion of the substrate laterally separates the isolation structure from the epi semiconductor material in the drain region.

One illustrative method disclosed herein of forming an LDMOS transistor above a semiconductor substrate includes forming an isolation structure in the substrate and forming a functional gate for the LDMOS transistor above the substrate, wherein a channel-side edge of the isolation structure is positioned vertically below the functional gate. In this example, the method also includes forming a dummy gate above the substrate, wherein a drain-side edge of the isolation structure is positioned vertically below the dummy gate, forming an epi cavity in the drain region, wherein a portion of the substrate is positioned between the drain-side edge of isolation structure and the epi cavity, and forming an epi semiconductor material in the epi cavity in the drain region.

BRIEF DESCRIPTION OF THE DRAWINGS

The disclosure may be understood by reference to the following description taken in conjunction with the accompanying drawings, in which like reference numerals identify like elements, and in which:

FIGS. 1-7 depict various novel methods of forming an LDMOS transistor and an IC product that includes such an LDMOS device.

Figure 1:
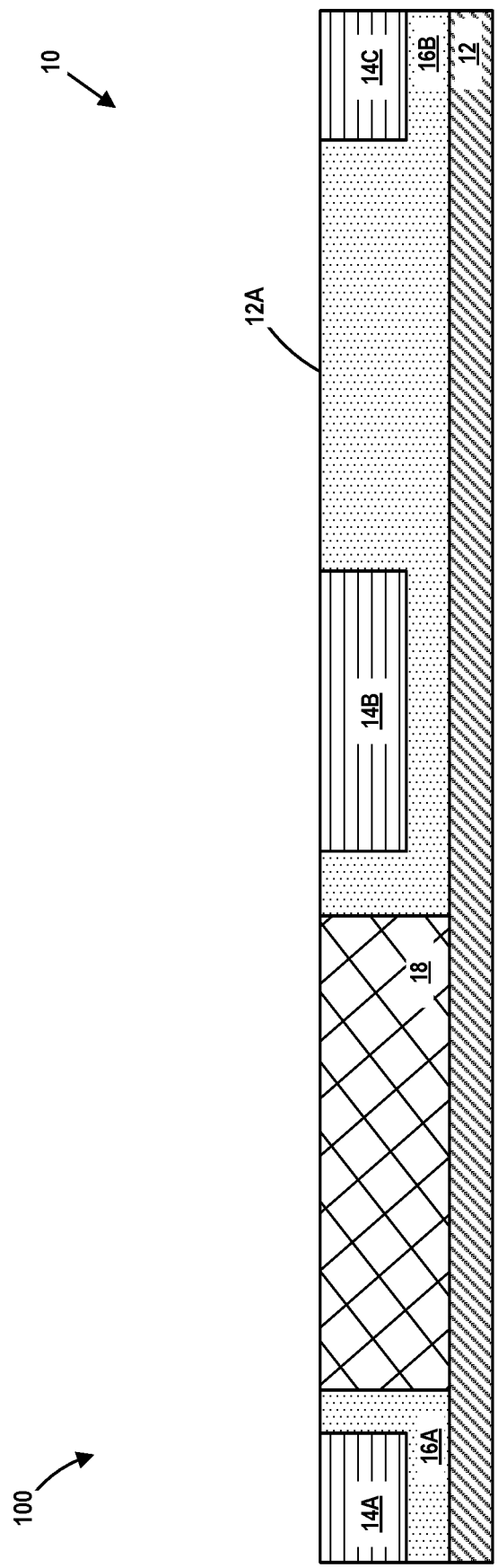

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-7 depict various novel methods of forming an LDMOS transistor 10 and an IC product 100 that includes such an LDMOS device 10. As will be appreciated by those skilled in the art after a complete reading of the present application, the LDMOS device 10 disclosed herein may be an N-type or P-type device and it may be formed on a bulk semiconductor substrate or a semiconductor-on-insulator substrate. Moreover, the LDMOS device 10 may come in a variety of different forms, e.g., the LDMOS device 10 may be a planar device, a FinFET device, etc. Additionally, the gate structure of the LDMOS device 10 may be manufactured using known gate-first or replacement gate manufacturing techniques. For purposes of disclosure only, the LDMOS device 10 described below will be an N-type, planar device that is formed above a bulk semiconductor substrate wherein the gate structure of the LDMOS device 10 is formed by performing known replacement gate manufacturing techniques. However, as noted above, the various inventions disclosed herein should not be considered to be limited to the particular example shown in the attached drawings and described below.

FIG. 1 depicts the IC product 100 after several steps have been taken to form the LDMOS device 10 above a bulk semiconductor substrate 12 having an upper surface 12A. As noted above, the LDMOS device 10 may also be formed on a semiconductor-on-insulator (SOI) substrate that includes a base semiconductor layer, a buried insulation layer and an active semiconductor layer positioned above the buried insulation layer, wherein transistor devices are formed in and above the active semiconductor layer. The substrate (irrespective of its form) may be made of silicon or it may be made of semiconductor materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

FIG. 1 depicts the LDMOS device 10 after several process operations were performed to form a plurality of isolation structures 14A-C (collectively referenced using the numeral 14), a plurality of N-wells 16A-B (collectively referenced using the numeral 16) and a P-well 18 in the substrate 12. The isolation structures 14 may be comprised of a variety of different materials, e.g., silicon dioxide, etc., and they may be formed by performing traditional etching, deposition and planarization processes. The N-wells 16 and the P-well 18 may be formed by performing traditional ion implantation process operations through patterned implant masks (not shown) that were formed above the substrate 12. The concentration of dopant atoms in the N-wells 16 and the P-well 18 as well as the physical depth of these wells may vary depending upon the particular application. The particular dopant materials used to form the doped wells may also vary depending upon the particular application, e.g., arsenic for the N-wells 16 and boron for the P-well 18. Of course, if the LDMOS device 10 were a P-type device, the doping of the wells 16, 18 would be reversed.

Figure 2:
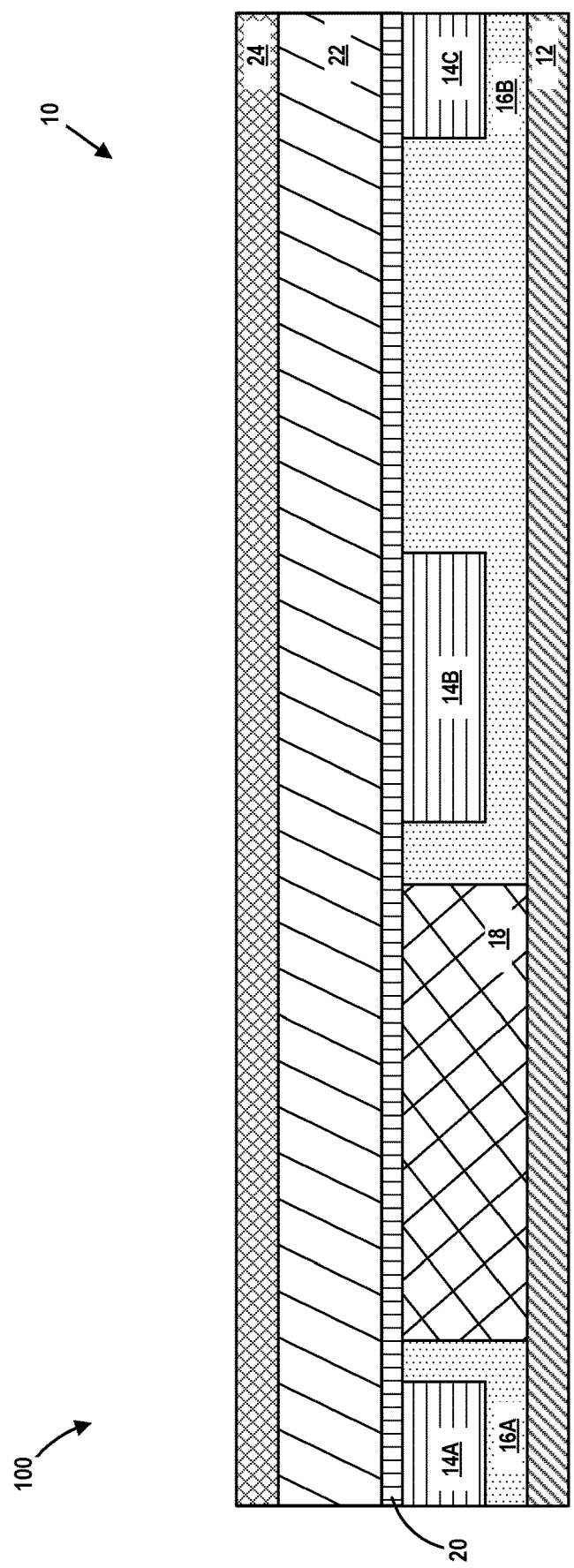

As noted above, in the particular example depicted herein, the gate structure of the LDMOS device 10 will be formed by performing known replacement gate manufacturing techniques. Accordingly, FIG. 2 depicts the product 100 after a layer of sacrificial gate insulation material 20, a layer of sacrificial gate electrode material 22 and a layer of gate cap material 24 was formed above the substrate 12. In one illustrative example, the layer of sacrificial gate insulation material 20 may be comprised of silicon dioxide and it may be formed by performing a deposition process or by performing a thermal growth process. The layer of sacrificial gate electrode material 22 may be comprised of a variety of materials, e.g., amorphous silicon, polysilicon, etc., it may be formed by performing a blanket-deposition process across the substrate 12 and its as-deposited upper surface may be planarized (by performing a chemical mechanical planarization (CMP) process). The layer of gate cap material 24 may be comprised of a variety of different materials, e.g., silicon nitride, and it may be formed on the layer of sacrificial gate electrode material 22 by performing a blanket-deposition process. The thickness of the layers of material 20, 22 and 24 may vary depending upon the particular application.

Figure 3:
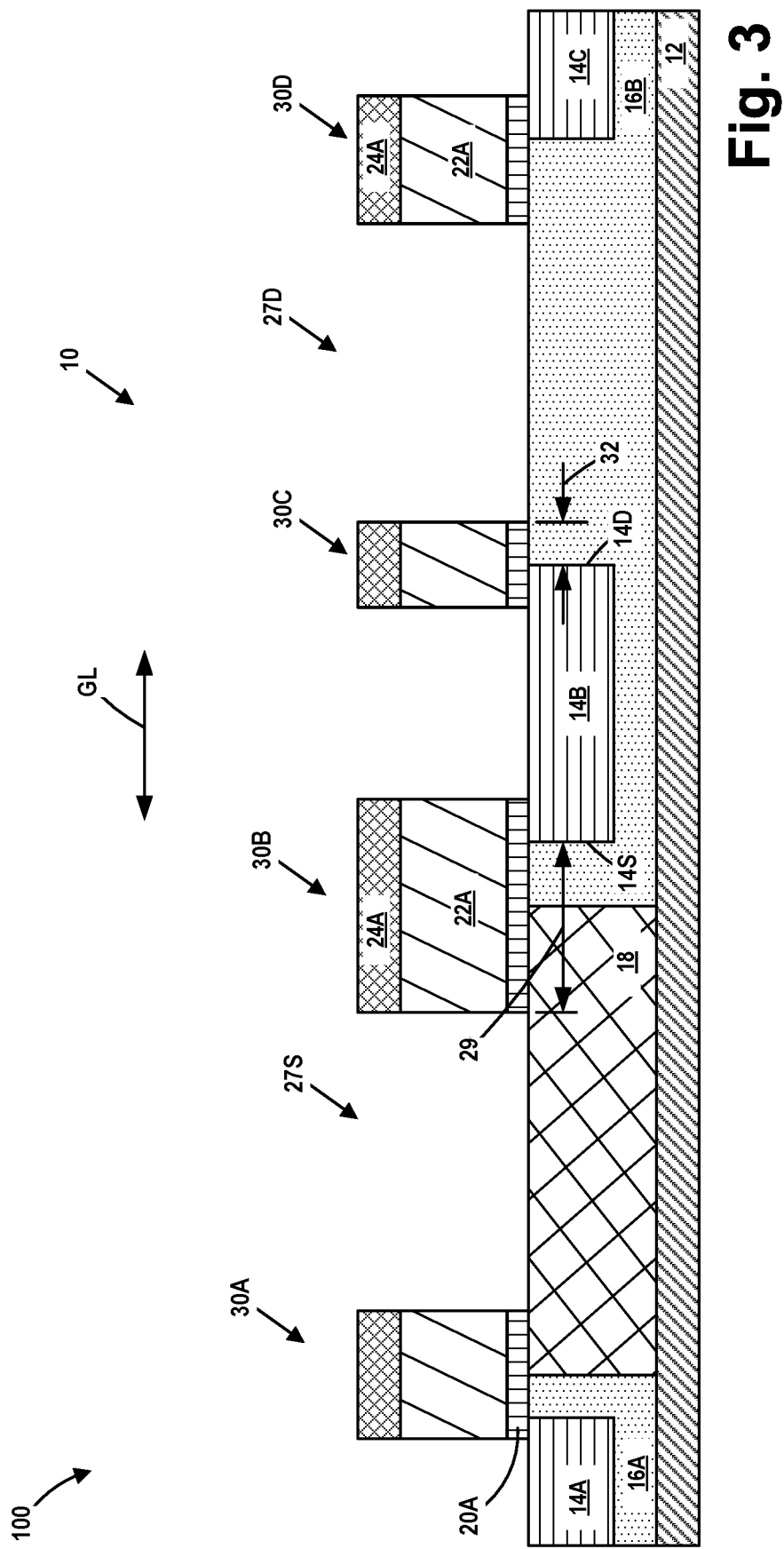

FIG. 3 depicts the IC product 100 after several process operations were performed to form a plurality of sacrificial gate structures 30A-D (collectively referenced using the numeral 30) above the substrate 12. First, a patterned etch mask (not shown), e.g., a patterned layer of photoresist, was formed above the layer of gate cap material 24. Then, an etching process was performed through the patterned etch mask so as to pattern the layer of gate cap material 24, thereby resulting in the gate caps 24A depicted in FIG. 3. Thereafter, the patterned etch mask was removed and another etching process was performed through the patterned gate caps 24A to remove the exposed portions of the layer of sacrificial gate electrode material 22 so as to result in the patterned sacrificial gate electrode structures 22A depicted in FIG. 3. Thereafter, another etching process was performed to pattern the layer of sacrificial gate insulation material 20 thereby resulting in the patterned layers of sacrificial gate insulation layers 20A.

As will be described more fully below, the sacrificial gates structures 30A, 30B and 30D will be replaced with RMG gate structures for functional transistor devices. The sacrificial gate structure 30C will be replaced with an RMG structure but it will not be an operational part of any transistor device. The sacrificial gate structure 30B is for the LDMOS device 10 and the sacrificial gate structures 30A and 30D are sacrificial gate structures for other functional transistor devices that will be formed on the IC product 100. The LDMOS device 10 will comprise a source region 27S, a drain region 27D and a channel region 29. The source region 27S for the LDMOS device 10 will be formed in the P-well 18 and the drain region 27D for the LDMOS device 10 will be formed in the second N-well 16B. The channel region 29 is laterally positioned between the source region 27S and the isolation structure 14B. In a cross-sectional view taken through the isolation structure 14B in a direction corresponding to the gate length direction of the LDMOS device 10, the isolation structure 14B has a channel-side edge 14S and a drain-side edge 14D. As depicted, in one illustrative embodiment. the channel-side edge 14S is positioned vertically below the sacrificial gate structure 30B for the LDMOS device 10. In one illustrative example, the isolation structure 14B may extend under the sacrificial gate structure 30B by a distance of about 1-300 nm based upon current day technology.

The lateral width (critical dimension) of the sacrificial gate structures 30 (in the gate-length direction (GL) of the devices) may vary depending upon the particular application, and they may be different from one another. Typically, the critical dimension of the sacrificial gate structure 30B for the LDMOS device 10 may be larger than that of the other gate structures, e.g., the critical dimension of the gate structure 30B may be about 500 nm, while the sacrificial gate structures 30A and 30D may have a critical dimension of about 200 nm. The critical dimension of the sacrificial gate structure 30C may be independent of the dimensions of the other gate structures 30A, 30B and 30D. In one illustrative embodiment, the sacrificial gate structure 30C may have a critical dimension that falls within the range of about 70-150 nm. Of course, the above numerical values are based upon current-day technology and are they are only provided by way of example.

Figure 4:
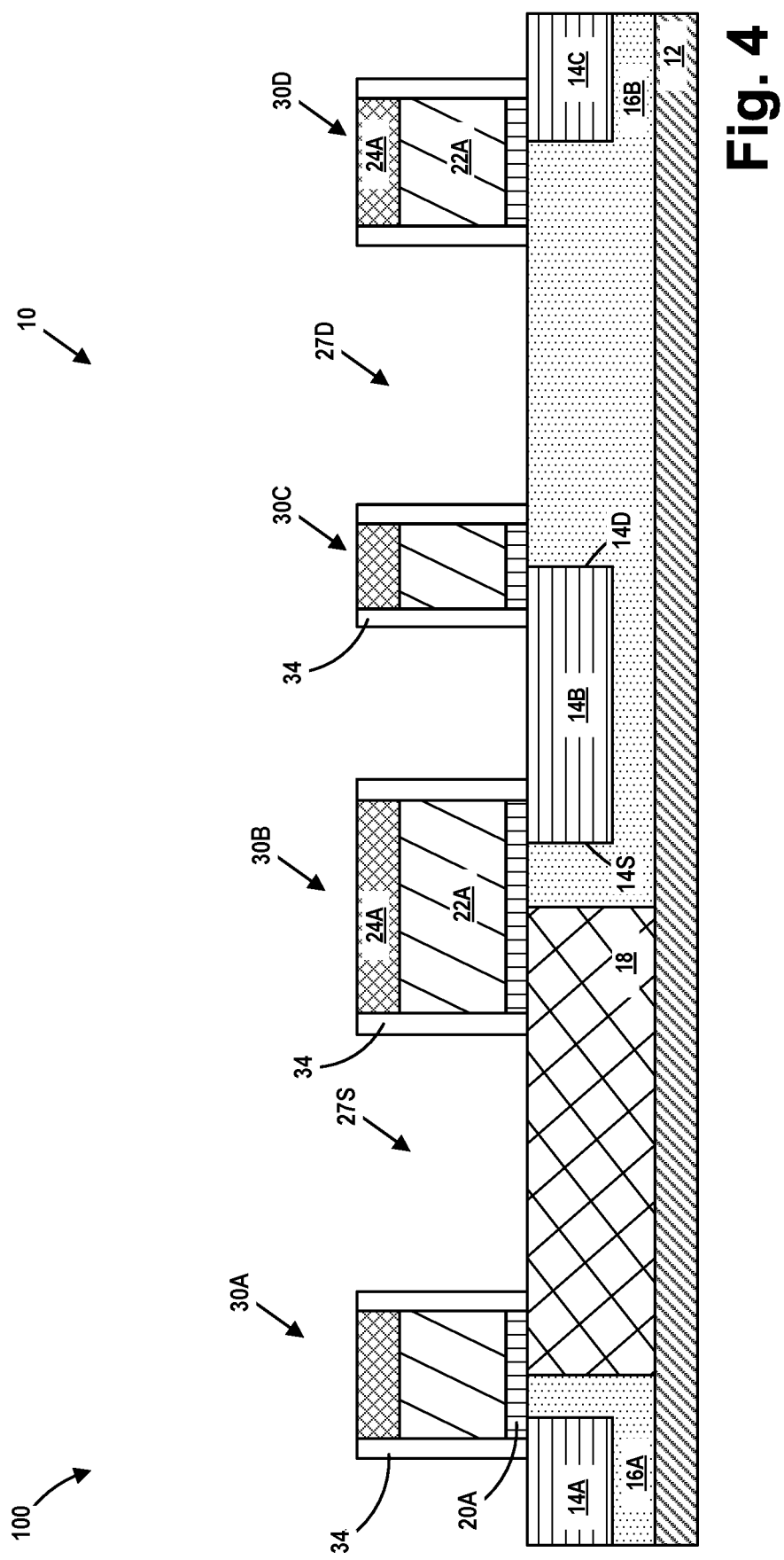

Importantly, the sacrificial gate structure 30C is positioned such that at least a portion of the sacrificial gate structure 30C is positioned above or covers the drain-side edge 14D of the isolation structure 14B. As depicted, a portion of the sacrificial gate structure 30C overlaps the drain-side edge 14D by a distance 32 which may vary depending upon the particular application. In one illustrative embodiment, the distance 32 may range from about 1-20 nm FIG. 4 depicts the product 100 after simplistically depicted sidewall spacers 34 were formed around and adjacent the entire perimeter of the sacrificial gate structures 30. Although only a single sidewall spacer 34 is depicted in the drawings for each of the sacrificial gate structures 30, in practice, more than one sidewall spacer may be formed adjacent the sacrificial gate structures 30. The sidewall spacers 34 may be formed by depositing a conformal layer of spacer material (not shown) above the substrate 12 and thereafter performing an anisotropic etching process to remove horizontally positioned portions of the layer of spacer material. The spacers 34 may be of any desired thickness (as measured at their base) and they may be comprised of a variety of different materials, e.g., silicon dioxide, a low-k material, silicon nitride, SiCN, SiN, SiCO, and SiOCN, etc. As to terminology, the combination of a sacrificial gate structure 30, a gate cap 24A and the at least one sidewall spacer 34 will be collectively referred to as a gate. Thus, FIG. 4 depicts the formation of four gates.

Figure 5:
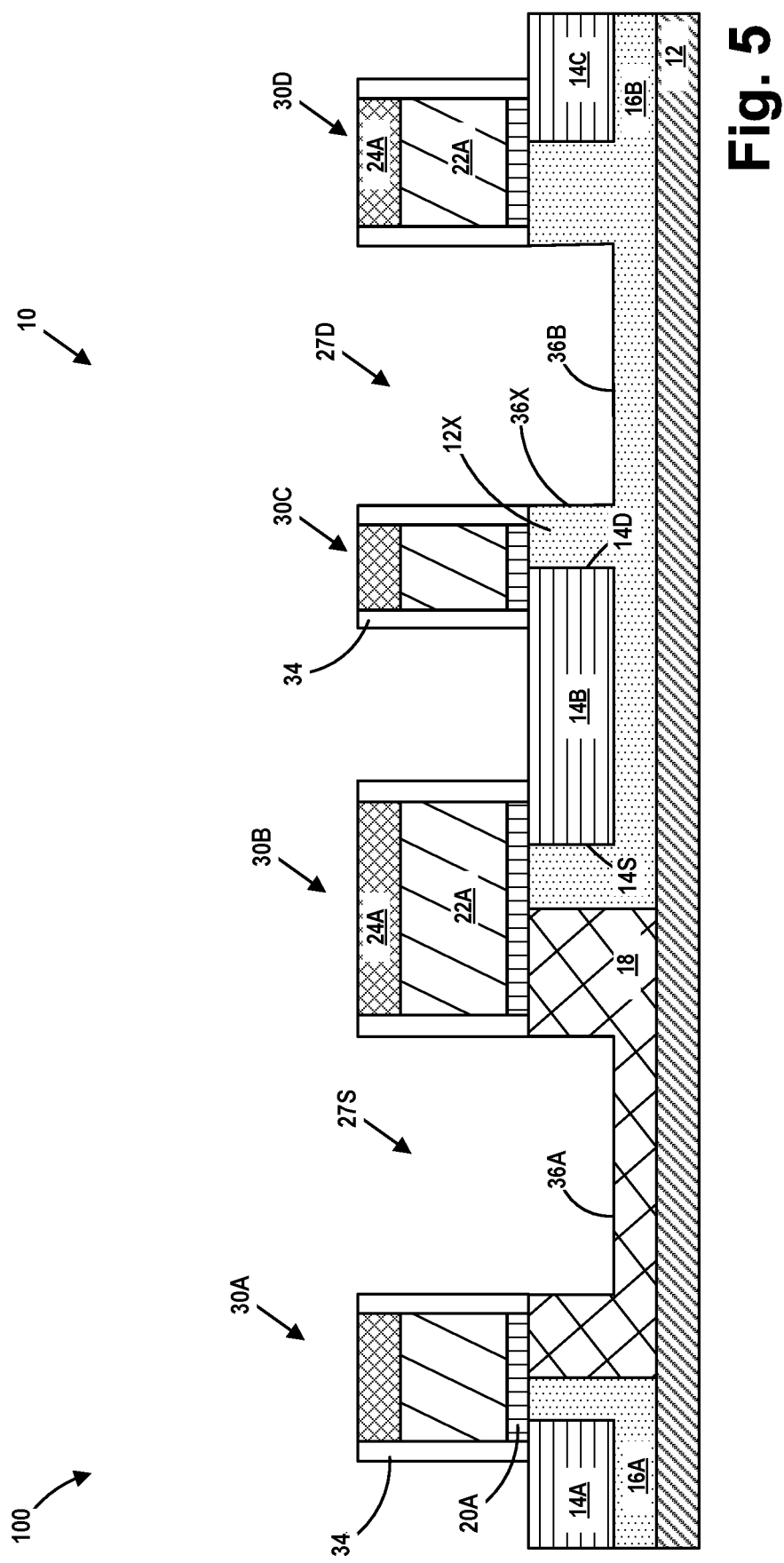

FIG. 5 depicts the product after an etching process was formed to form a plurality of epi cavities 36A-B (collectively referenced using the numeral 36) in the substrate 12 in the source (27S) and drain (27D) regions, respectively, of the LDMOS device 10. The epi cavities 36 may be formed by performing an anisotropic etching process through a patterned etch mask (not shown) that was formed on the product 100. Importantly, in this example, the side 36X of the epi cavity 36B in the drain region 27D is laterally offset or spaced apart from the drain-side edge 14D of the isolation structure 14B due to the formation of the gate that comprises the sacrificial gate structure 30C. Stated another way, the side 36X of the epi cavity 36B in the drain region 27D is substantially self-aligned with respect to the at least one sidewall spacer 34 positioned adjacent the sacrificial gate structure 30C and a portion 12X of the substrate 12 laterally separates or is positioned between the isolation structure 14B and the epi cavity 36B. As a result, only semiconductor material is exposed by formation of the epi cavities 36, i.e., the bottom surface and side surfaces of the epi cavities are semiconductor material. The depth of the epi cavities 36 may vary depending upon the particular application.

Figure 6:
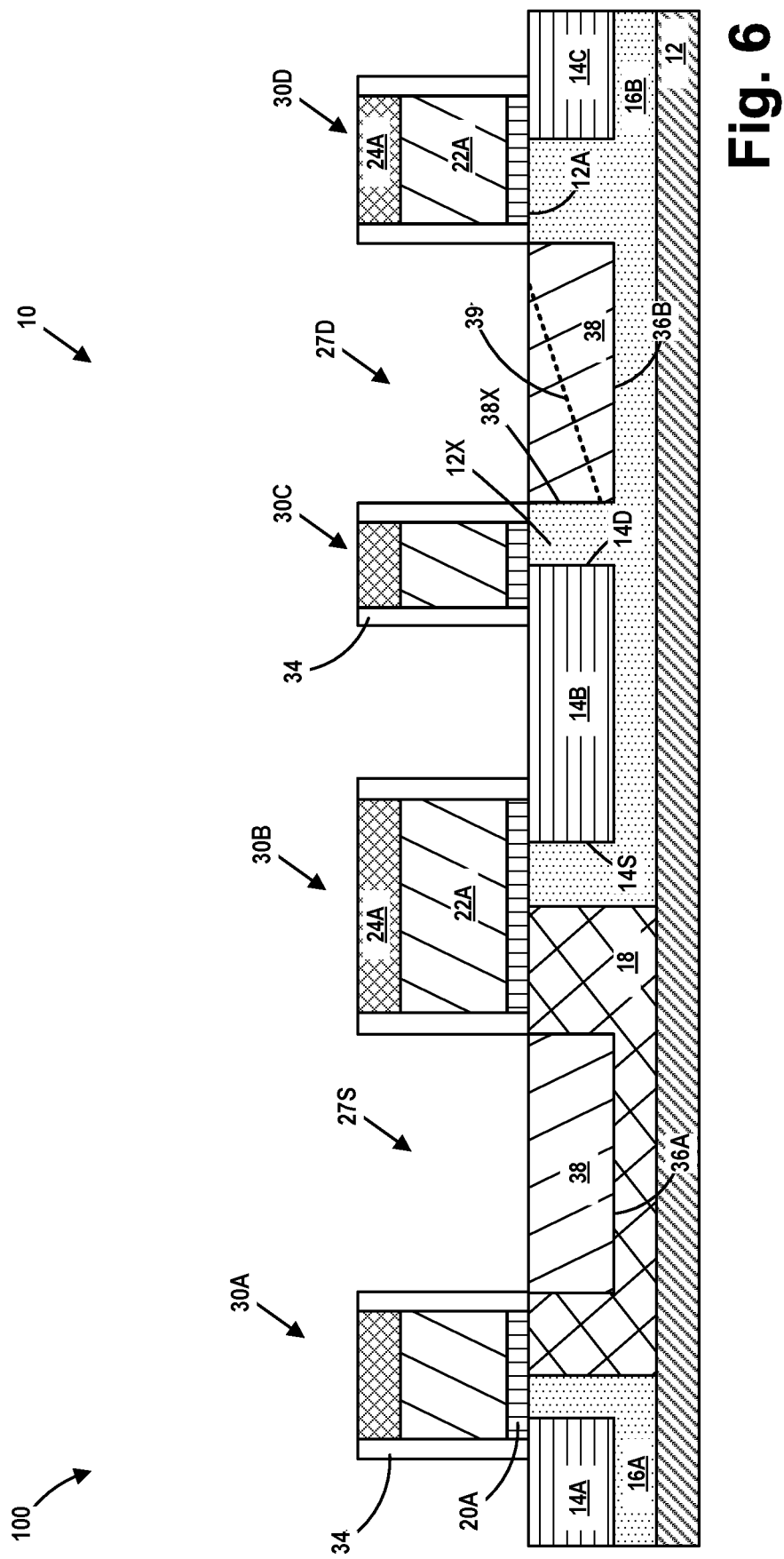

FIG. 6 depicts the product 100 after an epitaxial growth process was performed to form an in-situ doped epi semiconductor material 38 in the epi cavities 36. In the depicted example, the regions of epi semiconductor material 38 are formed such that the upper surface of the regions of epi semiconductor material 38 is substantially co-planar with the upper surface 12A of the substrate 12. In other applications, the epi growth process may be performed for a sufficient duration such that portions of the epi semiconductor material 38 are positioned above the upper surface 12A of the substrate 12. The epi semiconductor material 38 may be made of any of a variety of different semiconductor materials. In the case where the LDMOS device 10 is an N-type device, the epi semiconductor material 38 may be N-doped silicon carbon (SiC). In the case where the LDMOS device 10 is a P-type device, the epi semiconductor material 38 may be P-doped silicon germanium (SiGe). The epi semiconductor material 38 may also be initially formed as undoped epi material and an ion implantation process may be performed to introduce the desired dopant atoms into the undoped epi material. As depicted, the side 38X of the epi material 38 in the drain region 27D is laterally offset or spaced apart from the drain-side edge 14D of the isolation structure 14B. Stated another way, the side 38X of the epi material 38 in the drain region 27D is substantially self-aligned with respect to the at least one sidewall spacer 34 positioned adjacent the sacrificial gate structure 30C and the portion 12X of the substrate 12 laterally separates or is positioned between the isolation structure 14B and the epi material 38. In one illustrative embodiment, the isolation structure 14B is laterally separated from the epi semiconductor 38 material in the drain region 27D by about 100-1000 nm.

With continued reference to FIG. 6, absent the formation of the sacrificial gate structure 30C, the epic cavity 36B would have been self-aligned with the drain-side edge 14D of the isolation structure 14B, i.e., portions of the drain-side edge 14D of the isolation structure 14B would have been exposed by the formation of the epi cavity 36B. Epi semiconductor material will not grow on such isolation material. As a result, in prior art situations where part of the isolation structure 14B is exposed by the epi cavity 36B, the growth of the epi semiconductor material 38 in the epi cavity 36B may be substantially less uniform leading to incomplete filling of the epi cavity 36B as reflected by the simplistically dashed slanted line 39 in FIG. 6. Such incomplete formation of the epi semiconductor material 38 in drain region 27D of the LDMOS device 10 can lead to reduced device performance due to the reduced volume of epi semiconductor material in the drain region and/or complete device failure if a conductive contact structure cannot adequately be formed to contact the reduced-size region of epi semiconductor material in the drain region.

At the point of processing depicted in FIG. 6, traditional manufacturing operations may be performed to complete the product 100, as shown in FIG. 7. First, simplistically depicted final gate structures 130A-D were formed on the product 100. The final gate structure 130B is for the LDMOS device 10, the final gate structures 130A and 130D are final gate structures for other functional transistor devices that will be formed on the IC product 100. In one illustrative process flow, a layer of insulating material 40 (e.g., an ILD layer) was formed across the substrate 12. At that point, one or more CMP process operations were performed to remove the sacrificial gate caps 24A to expose the underlying sacrificial gate structures 22. At that point, the sacrificial gate electrodes 22A and the sacrificial gate insulation layers 20A were removed so as to form the plurality of replacement gate cavities within each of the spacers 34. Then the materials for the final gate structures 130 were sequentially formed in the replacement gate cavities. Typically this would involve performing a plurality of conformal deposition processes to form a conformal gate insulation layer (not separately shown), a conformal work-function adjusting metal layer (not separately shown) and one or more additional conformal metal-containing layers (not separately shown) across the product 100 and in the replacement gate cavities. Thereafter, a blanket deposition process was performed to form a bulk conductive material (not separately shown) (e.g., tungsten, aluminum, etc.) so as to over-fill the remaining portion of the replacement gate cavities. Next, one or more CMP processes were performed so as to remove excess portions of the various materials of the final gate structures 130 that are positioned above the upper surface of the layer of insulating material 40 and outside of the replacement gate cavities. At that point, one or more recess etching processes were performed to recess the vertical height of the materials of the final gate structures 130 so as to make room for a final gate cap 41. The final gate caps 41 may be formed by blanket depositing a layer of the material for the gate caps 41 above the devices and in the space above the recessed gate materials for the final gate structures 130. In one illustrative example, the gate insulation layer may be comprised of a high-k insulating material (a material having a dielectric constant greater than 10), such as hafnium oxide, etc. In one illustrative example where the LDMOS device 10 is an N-type device, the conformal work function adjusting layer may be comprised of a variety of different materials including, but not limited to, TiAlC, TiN, TiN (with a relatively high amount of N-type dopant), TaN, etc. The metal-containing layer may be comprised of a variety of different materials including, but not limited to, TiN, W, etc. As to terminology, the combination of a final gate structure 130, a final gate cap 41 and the at least one sidewall spacer 34 will be collectively referred to as a gate. Thus, FIG. 7 depicts the formation of four gates. In one illustrative example, the gate cap 41 may be omitted from the dummy gate structure 130C, i.e., the entire upper surface of the final gate structure 130C may be exposed.

After the formation of the final gate structures 130, traditional manufacturing operations are performed to form various layers of insulating material (layers 42, 44, 46 and 48) and various conductive structures 50, 52, 54 on the product 100. The layers of insulating material may be comprised of a variety of different materials, e.g., the layers 42 and 46 may be comprised of silicon nitride while the layers 44 and 48 may be comprised of silicon dioxide. The conductive structures 52 are generally referred to as conductive source/drain structures or source/drain metallization structures. In one illustrative embodiment, the source/drain conductive structures 52 may be essentially line-type features that extend into and out of the plan of the drawing in FIG. 7. In some applications, the source/drain conductive structures 52 may be referred to as trench silicide structures. As indicated, the source/drain conductive structures 52 are conductively coupled to the source and drain regions of the LDMOS device 10. The conductive structures 50 are gate contact structures that are conductively coupled to the final gate structures 130A, 130B and 130D. Note that the dummy or inoperable gate structure 130C is not contacted by a gate contact structure 50 and, as noted above, the dummy gate structure 130C is not a functional element for any transistor device—it simply occupies space on the IC product 100. The contact structures 54 are source/drain contact structures 54 that are conductively coupled to the source/drain conductive structures 52. Within the industry, the gate contact structures 50 and the source/drain contact structures 54 are sometimes referred to as device level contacts. The gate contact structures 50 and the source/drain contact structures 54 may be made of a variety of different conductive materials, e.g., tungsten, copper, etc.

As will be appreciated by those skilled in the art after a complete reading of the present application, there are several novel devices and methods disclosed herein. One illustrative IC product 100 disclosed herein includes a gate structure 130B positioned above a semiconductor substrate 12, a source region 27S and a drain region 27D, both of which comprise an epi semiconductor material 38, wherein at least a portion of the source and drain regions are positioned in the substrate, and an isolation structure 14B positioned in the substrate 12 between the source region 27S and the drain region 27D, wherein the isolation structure 14B comprises a channel-side edge 14S and a drain-side edge 14D, wherein the channel-side edge 14S is positioned vertically below the gate structure 130B and wherein a portion 12X of the substrate 12 laterally separates the isolation structure 14B from the drain region 27D. In other embodiments, the integrated circuit product 100 further includes a dummy gate structure 130C that is positioned above the drain-side edge 14D of the isolation structure 14B. In the depicted example, the gate structure 130B and the dummy gate structure 130C are comprised of the same materials and they are manufactured at the same time. The IC product 100 also include a conductive gate contact 50 that is conductively coupled to the gate structure 130B and there is an absence of any conductive contact structure on the IC product that conductively contacts the dummy gate structure 130C. That is, in one example, a non-conductive gate cap layer 41 is positioned above an entire upper surface of the dummy gate structure 130C.

One illustrative method of forming an LDMOS transistor 10 above a semiconductor substrate 12 includes forming an isolation structure 14B in the semiconductor substrate 12, forming a functional gate (comprised of the functional gate structure 130B, the final gate cap 41 and the at least one sidewall spacer 34) for the LDMOS transistor 10 above the semiconductor substrate 12, wherein a channel-side edge 14S of the isolation structure 14B is positioned vertically below the functional gate, and forming a dummy gate (comprised of the dummy gate structure 130C, the final gate cap 41 and the at least one sidewall spacer 34) above the substrate 12, wherein a drain-side edge 14D of isolation structure 14B is positioned vertically below the dummy gate. In this example, the method also includes forming an epi cavity 36B in the drain region 27D, wherein a portion of the substrate 12 is positioned between the drain-side edge 14D of isolation structure 14B and the epi cavity 36B, and forming an epi semiconductor material 38 in the epi cavity 36B in the drain region 27D.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit product, comprising:
a gate structure positioned above a semiconductor substrate;
a source region and a drain region, both of which comprise an epi semiconductor material, wherein at least a portion of the epi semiconductor material in the source and drain regions is positioned in a well in the substrate; and
an isolation structure positioned in the well in the substrate between the epi semiconductor material in the source region and the epi semiconductor material in the drain region,
wherein a portion of the isolation structure is positioned vertically below a portion of the gate structure and wherein a portion of the well in the substrate laterally separates the isolation structure from the epi semiconductor material in the drain region.

2. The integrated circuit product of claim 1, wherein the isolation structure comprises a channel-side edge and a drain-side edge, and wherein the integrated circuit product further comprises a dummy gate structure that is positioned above the drain-side edge of the isolation structure.

3. The integrated circuit product of claim 2, wherein the dummy gate structure and the gate structure comprise the same materials.

4. The integrated circuit product of claim 2, further comprising a conductive gate contact structure that is conductively coupled to the gate structure.

5. The integrated circuit product of claim 4, further comprising a non-conductive gate cap layer positioned above an entire upper surface of the dummy gate structure.

6. The integrated circuit product of claim 5, wherein there is an absence of a conductive contact structure that conductively contacts the dummy gate structure.

7. The integrated circuit product of claim 2, wherein the product further comprises at least one sidewall spacer positioned adjacent the dummy gate structure, wherein one side of the epi semiconductor material in the drain region is substantially self-aligned with respect to the at least one sidewall spacer.

8. The integrated circuit product of claim 1, wherein the isolation structure is laterally separated from the epi semiconductor material in the drain region by about 100-1000 nm.

9. The integrated circuit product of claim 1, wherein the gate structure, the source region and the drain region are part of an N-type LDMOS transistor device, the substrate comprises a bulk silicon substrate, the isolation structure comprises silicon dioxide and the gate structure comprises a conformal high-k gate insulation layer and at least one conformal layer of conductive metal-containing material.

10. The integrated circuit product of claim 1, further comprising a dummy gate structure positioned above a drain-side edge of the isolation structure.

11. The integrated circuit product of claim 10, further comprising a non-conductive gate cap layer positioned above a surface of the dummy gate structure.

12. The integrated circuit product of claim 10, further comprising a sidewall spacer positioned adjacent the dummy gate structure, wherein a side of the epi semiconductor material is substantially self-aligned with respect to the sidewall spacer.

13. The integrated circuit product of claim 1, wherein the gate structure, the source region and the drain region comprise a portion of an LDMOS transistor device.

14. An integrated circuit product, comprising:
a gate structure positioned above a semiconductor substrate;
a source region and a drain region, both of which comprise an epi semiconductor material, wherein at least a portion of the epi semiconductor material in the source and drain regions is positioned in a well in the substrate;
an isolation structure positioned in the well in the substrate between the epi semiconductor material in source region and the epi semiconductor material in the drain region, wherein the isolation structure comprises a channel-side edge and a drain-side edge, wherein the channel-side edge of the isolation structure is positioned vertically below the gate structure and wherein a portion of the well in the substrate laterally separates the isolation structure from the epi semiconductor material in the drain region; and
a dummy gate structure that is positioned above the drain-side edge of the isolation structure.

15. The integrated circuit product of claim 14, wherein the dummy gate structure and the gate structure comprise the same materials and wherein the integrated circuit product further comprises a non-conductive gate cap layer positioned above an entire upper surface of the dummy gate structure.

16. The integrated circuit product of claim 15, further comprising a conductive gate contact structure that is conductively coupled to the gate structure and wherein there is an absence of a conductive gate contact structure that conductively contacts the dummy gate structure.

17. The integrated circuit product of claim 14, wherein the isolation structure is laterally separated from the epi semiconductor material in the drain region by about 100-1000 nm.

18. The integrated circuit product of claim 14, wherein the product further comprises at least one sidewall spacer positioned adjacent the dummy gate structure, wherein one side of the epi semiconductor material in the drain region is substantially self-aligned with respect to the at least one sidewall spacer.

19. The integrated circuit of claim 14, further comprising a non-conductive gate cap layer positioned above a surface of the dummy gate structure.

20. The integrated circuit product of claim 14, further comprising a sidewall spacer positioned adjacent the dummy gate structure, wherein a side of the epi semiconductor material is substantially self-aligned with respect to the sidewall spacer.

* * * * *